United States Patent
Hu et al.

(10) Patent No.: US 11,402,538 B2
(45) Date of Patent: Aug. 2, 2022

(54) GRAVITY GRADIENT MEASUREMENT METHOD AND APPARATUS

(71) Applicant: INSTITUTE OF ELECTRICAL ENGINEERING, CHINESE ACADEMY OF SCIENCES, Beijing (CN)

(72) Inventors: Xinning Hu, Beijing (CN); Qiuliang Wang, Beijing (CN); Jinyan Lu, Beijing (CN); Hui Wang, Beijing (CN); Chunyan Cui, Beijing (CN)

(73) Assignee: INSTITUTE OF ELECTRICAL ENGINEERING, CHINESE ACADEMY OF SCIENCES, Beijing (CN)

( * ) Notice: Subject to any disclaimer, the term of this patent is extended or adjusted under 35 U.S.C. 154(b) by 288 days.

(21) Appl. No.: 16/491,936

(22) PCT Filed: Jun. 30, 2017

(86) PCT No.: PCT/CN2017/091107
§ 371 (c)(1),
(2) Date: Sep. 6, 2019

(87) PCT Pub. No.: WO2018/161474
PCT Pub. Date: Sep. 13, 2018

(65) Prior Publication Data
US 2020/0073010 A1 Mar. 5, 2020

(30) Foreign Application Priority Data
Mar. 9, 2017 (CN) .......................... 201710137515.X (51) Int. Cl.
*G01V 7/02* (2006.01)
*G01V 13/00* (2006.01)
*H05K 9/00* (2006.01)

(52) U.S. Cl.
CPC ................ *G01V 7/02* (2013.01); *G01V 13/00* (2013.01); *H05K 9/0077* (2013.01)

(58) Field of Classification Search
CPC ... G01V 7/00; G01V 7/02; G01V 7/06; G01V 13/00; H05K 9/0081
See application file for complete search history.

(56) References Cited

U.S. PATENT DOCUMENTS 3,926,054 A 12/1975 Buck
3,965,753 A * 6/1976 Browning, Jr. ....... G01P 15/131
73/504.18

(Continued)

FOREIGN PATENT DOCUMENTS

| CN | 201477216 U | 5/2010 |
| CN | 102099710 A | 6/2011 |

(Continued)

OTHER PUBLICATIONS

English translation of International Search Report for International Application No. PCT/CN2017/091107, dated Dec. 14, 2017, 4 pages.

(Continued)

*Primary Examiner* — Natalie Huls
*Assistant Examiner* — Sharad Timilsina
(74) *Attorney, Agent, or Firm* — Armstrong Teasdale LLP (57) ABSTRACT

Provided is a gravity gradient measurement apparatus and measuring method, wherein a turntable rotates horizontally around an earth-vertical axis, a vacuum layer is arranged on the turntable defining a first chamber, a first three-axis accelerometer and a second three-axis accelerometer are located in the first chamber, the first three-axis accelerometer and the second three-axis accelerometer are arranged symmetrically on an x axis with respect to an origin of coordinates. Both the first three-axis accelerometer and the (Continued)

second three-axis accelerometer have a distance of R from the origin of coordinates. The first three-axis accelerometer and the second three-axis accelerometer are arranged symmetrically on an z axis with respect to the origin of coordinates, and the first three-axis accelerometer and the second three-axis accelerometer are spaced at a distance of h on the z axis. The measurement module uses measurements of the accelerometers to determine gravity gradients on the coordinate axes.

13 Claims, 5 Drawing Sheets

(56) References Cited

U.S. PATENT DOCUMENTS

| | | | | |
|---|---|---|---|---|
| 5,357,802 | A | * | 10/1994 | Hofmeyer ............... G01V 7/00 73/382 G |
| 5,487,305 | A | * | 1/1996 | Ristic ................... G01P 15/125 73/514.18 |
| 8,069,725 | B2 | | 12/2011 | Moody |
| 8,347,711 | B2 | | 1/2013 | Rice et al. |
| 2006/0207326 | A1 | | 9/2006 | Moody |
| 2009/0235740 | A1 | | 9/2009 | Carr |
| 2010/0005882 | A1 | | 1/2010 | Van Kann |
| 2010/0223796 | A1 | * | 9/2010 | Imamura ............... E21B 47/022 33/321 |
| 2011/0265563 | A1 | | 11/2011 | Van Kann |
| 2012/0210783 | A1 | * | 8/2012 | Carroll .................. G01V 7/00 73/382 G |

FOREIGN PATENT DOCUMENTS

| | | |
|---|---|---|
| CN | 102227651 A | 10/2011 |
| CN | 102608668 A | 7/2012 |
| CN | 104133252 A | 5/2014 |
| CN | 104597520 A | 5/2015 |
| CN | 204613420 U | 9/2015 |
| CN | 105652334 A | 6/2016 |
| CN | 105674972 A | 6/2016 |
| CN | 105717553 A | 6/2016 |
| CN | 105738962 A | 7/2016 |
| CN | 105738963 A | 7/2016 |
| CN | 205594182 U | 9/2016 |
| WO | 2016030435 A1 | 3/2016 |

OTHER PUBLICATIONS

Wu et al. "The Research Situation of the Gravity Gradiometer in the World", Geophysical & Geochemical Exploration, vol. 37, No. 5, Oct. 2013. 9 pages with unofficial English Abstract Full translation unavailable.

Office Action for Chinese Patent Application No. 201710137515.X, dated Jun. 5, 2018, 5 pages with unofficial English translation.

Yuan et al. "Error Analysis and Compensation of Full Tensor Gravity Gradiometer Measurements", Journal of Jilin University (Earth Science Edition), vol. 44, No. 3, May 2014. 9 pages. Only English abstract available.

* cited by examiner

GRAVITY GRADIENT MEASUREMENT METHOD AND APPARATUS

CROSS-REFERENCE TO RELATED APPLICATIONS

This application is a U.S. National Phase Application of PCT/CN2017/091107, filed Jun. 30, 2017, which claims the benefit of priority to CN Application No. 201710137515.X, filed Mar. 9, 2017, the contents of which are hereby expressly incorporated by reference in their entirety.

TECHNICAL FIELD

The present invention relates to the field of gravity measurement, and particular to a gravity gradient measurement apparatus and a measuring method.

BACKGROUND

Gravity gradient measurement began with the survey and exploration of oil and gas. In the United States in the 1920s, the torsional scale gravity gradiometer was the only effective tool for oil and gas exploration and survey. However, due to the bulky size and low efficiency, research on the interpretation method of gradient data lagged behind, the gradiometer has been gradually phased out. However, with the development of the times, the importance of high precision gravity gradient data has gradually become apparent, and it is indispensable whether for geological exploration, fine simulation of earth gravity field, and high precision inertial navigation.

Gravity gradient measurement is performed by measuring the variation of earth gravity acceleration with space. Being spatial differentiation of the earth gravity, the gravity gradient reflects the change rate of gravity along different directions in the space, therefore, the gravity gradient measurement can reflect details of gravity field source.

The gravest gradient measurement is advantageous mostly in that, the gravity gradient value or the high-order derivative of gravity has a higher resolution than the gravity itself. As a result, more accurate gravity value and vertical deviation can be obtained, through real-time measurement of the gravity gradient tensor component by means of a gravity gradiometer which measures the second-order derivative of the gravitational potential, which plays an important role in the development of space science, earth science and geological science and other science and technologies.

Although inertial navigation system has a high positioning accuracy, it has a defect that the error accumulates with time and must be adjusted regularly. Gravity gradient measurement is an important method for underwater correction or limitation of error accumulation of a passive autonomous inertial navigation system, and can not only improve the accuracy of inertial navigation, but also solve the long-term hidden problem of underwater navigation.

The gravity gradient is a first-order spatial derivative of the gravity acceleration vector, i.e., the second-order spatial derivative of gravity potential, which can be expressed by the following tensor:

$$\bar{\bar{\Gamma}} = \begin{bmatrix} \frac{\partial^2 \psi}{\partial x^2} & \frac{\partial^2 \psi}{\partial x \partial y} & \frac{\partial^2 \psi}{\partial x \partial z} \\ \frac{\partial^2 \psi}{\partial y \partial x} & \frac{\partial^2 \psi}{\partial y^2} & \frac{\partial^2 \psi}{\partial y \partial z} \\ \frac{\partial^2 \psi}{\partial z \partial x} & \frac{\partial^2 \psi}{\partial z \partial y} & \frac{\partial^2 \psi}{\partial z^2} \end{bmatrix} = \begin{bmatrix} \frac{\partial g_x}{\partial x} & \frac{\partial g_x}{\partial y} & \frac{\partial g_x}{\partial z} \\ \frac{\partial g_y}{\partial x} & \frac{\partial g_y}{\partial y} & \frac{\partial g_y}{\partial z} \\ \frac{\partial g_z}{\partial x} & \frac{\partial g_z}{\partial y} & \frac{\partial g_z}{\partial z} \end{bmatrix} = \begin{bmatrix} \Gamma_{xx} & \Gamma_{xy} & \Gamma_{xz} \\ \Gamma_{yx} & \Gamma_{yy} & \Gamma_{yz} \\ \Gamma_{zx} & \Gamma_{zy} & \Gamma_{zz} \end{bmatrix}$$

wherein, due to the symmetry and non-rotation property of the gravity gradient field, $\Gamma_{xy}$ and $\Gamma_{yx}$, $\Gamma_{xz}$ and $\Gamma_{zx}$, $\Gamma_{yz}$ and $\Gamma_{zy}$, $\Gamma_{xx}+\Gamma_{yy}+\Gamma_{zz}=0$, nine tensors of the gravity gradient can be simplified as five independent tensors. If five independent tensors are measured, the information of all nine tensors can be obtained, realizing measurement of the full-tensor gravity gradient.

Currently the gravity gradient measuring method is mostly based on the principle of differential acceleration measurement, and each component of the gravity gradient tensor can be obtained by different combinations of measurements between accelerometers.

Measurement of the full-tensor gravity gradient needs three orthogonal rotating axis to separate gradient signals, especially the non-diagonal components of the gravity gradient, or needs to use additional an angular accelerometer to measure the non-diagonal component and eliminate dynamic errors, which generally requires a combined structure of more than six accelerometers, thus greatly increasing the complexity and cost of the instrument system.

SUMMARY

The present invention is aimed at providing a gravity gradient measurement apparatus and a measuring method, so as to conduct full-tensor gravity gradient measurement through a simple method.

According to an aspect of the present invention, a gravity gradient measurement apparatus is provided, including a turntable, a first three-axis accelerometer, a second three-axis accelerometer, a vacuum layer and a measurement module, the turntable rotates horizontally around an earth-vertical axis, wherein:

the vacuum layer is arranged on the turntable and defining a first chamber with the turntable, the first three-axis accelerometer and the second three-axis accelerometer are located in the first chamber, the first three-axis accelerometer and the second three-axis accelerometer are arranged symmetrically on an x axis with respect to an origin of coordinates, both the first three-axis accelerometer and the second three-axis accelerometer have a distance of R from the origin of coordinates; the first three-axis accelerometer and the second three-axis accelerometer are arranged symmetrically on an z axis with respect to the origin of coordinates, and the first three-axis accelerometer and the second three-axis accelerometer are spaced at a distance of h on the z axis; and the measurement module determines a gravity gradient on the coordinate axes according to acceleration values measured by the first three-axis accelerometer and the second three-axis accelerometer.

Optionally, the gravity gradient measurement apparatus further includes:

an first magnetic shield, arranged in the first chamber, for shielding the interference of the external geomagnetic field, the first magnetic shield and the turntable define a second chamber, in which the first three-axis accelerometer and the second three-axis accelerometer are located.

Optionally, the first magnetic shield is a metal shield layer.

Optionally, the material of the first magnetic shield is permalloy.

Optionally, the gravity gradient measurement apparatus further includes:

a second magnetic shield, arranged in the second chamber, for shielding the interference of an external alternating current magnetic field, the second magnetic shield and the turntable define a third chamber, in which the first three-axis accelerometer and the second three-axis accelerometer are located.

The gravity gradient measurement apparatus further includes:

a liquid nitrogen layer, arranged between the first magnetic shield and the second magnetic shield.

Optionally, the second magnetic shield is a superconducting shield layer.

Optionally, the material of the second magnetic shield is a YBCO metallic compound.

Optionally, the first three-axis accelerometer and the second three-axis accelerometer respectively comprises a suspended mass, an x-axis acceleration detection electrode, a y-axis acceleration detection electrode and a z-axis acceleration detection electrode, the x-axis acceleration detection electrode, the y-axis acceleration detection electrode and the z-axis acceleration detection electrode define a cavity, and the suspended mass is suspended at a central position of the cavity;

the x-axis acceleration detection electrode, the y-axis acceleration detection electrode and the z-axis acceleration detection electrode are configured to measure a displacement of the suspended mass in the directions of the x axis, the y axis and the z axis, respectively, so as to obtain the acceleration in the directions of the x axis, the y axis and the z axis according to the measured displacement.

Optionally, the suspended mass is a hollow metal mass with an enclosed outer surface.

Optionally, the gravity gradient $\Gamma^g$ is:

$$\Gamma^g = \begin{bmatrix} \Gamma_{XX} & \Gamma_{XY} & \Gamma_{XZ} \\ \Gamma_{YX} & \Gamma_{YY} & \Gamma_{YZ} \\ \Gamma_{ZX} & \Gamma_{ZY} & \Gamma_{ZZ} \end{bmatrix}$$

wherein, $\Gamma_{XX}$, $\Gamma_{YY}$ and $\Gamma_{ZZ}$ are respectively the gravity gradient on the x axis, the y axis and the z axis, $\Gamma_{XY}$ and $\Gamma_{YX}$ are the gravity gradient on the x axis and the y axis, $\Gamma_{XZ}$ and $\Gamma_{ZX}$ the gravity gradient on the x axis and the z axis, and $\Gamma_{YZ}$ and $\Gamma_{ZY}$ are the gravity gradient on the y axis and the z axis, satisfying $\Gamma_{XX}+\Gamma_{YY}+\Gamma_{ZZ}=0$, $\Gamma_{XY}=\Gamma_{YX}$, $\Gamma_{XZ}=\Gamma_{ZX}$, $\Gamma_{YZ}=\Gamma_{ZY}$.

Optionally, the measurement module adopts the following formula $a_{1X}-a_{2X}=h \sin \omega t \Gamma_{YZ}-h \cos \omega t \Gamma_{XZ}+2R \sin 2\omega t \Gamma_{XY}-R \cos 2\omega t(\Gamma_{XX}-\Gamma_{YY})-R(\Gamma_{XX}+\Gamma_{YY})-2R\omega_z^2$ $a_{1Y}-a_{2Y}=h \cos \omega t \Gamma_{YZ}-h \sin \omega t \Gamma_{XZ}+2R \cos 2\omega t \Gamma_{XY}-R \sin 2\omega t(\Gamma_{XX}-\Gamma_{YY})+2R\dot\omega_z$ $a_{1Z}-a_{2Z}=2R \sin \omega t \Gamma_{YZ}-2R \cos \omega t \Gamma_{XZ}-h\Gamma_{ZZ}$ to determine components $\Gamma_{YZ}$, $\Gamma_{XZ}$, $\Gamma_{XY}$ and $\Gamma_{XX}-\Gamma_{YY}$ of the gravity gradient;

and determines a component $\Gamma_{ZZ}$ of the gravity gradient using the formula $\Gamma_{ZZ}=(a_{2Z}-a_{1Z})/h$;

wherein, $a_{1X}$, $a_{1Y}$ and $a_{1Z}$ respectively represent measurement outputs of the first three-axis accelerometer $a_1$ in the directions of the x axis, the y axis and the z axis;

$a_{2X}$, $a_{2Y}$ and $a_{2Z}$ respectively represent measurement outputs of the second three-axis accelerometer $a_2$ in the directions of the x axis, the y axis and the z axis; and $\omega$ is an angular velocity vector, and $\dot\omega_z$ is angular acceleration around the z axis.

According to another aspect of the present invention, a gravity gradient measuring method is provided, including:

measuring acceleration using a first three-axis accelerometer and a second three-axis accelerometer;

determining a gravity gradient on the coordinate axes according to the acceleration;

wherein, the first three-axis accelerometer and the second three-axis accelerometer are arranged in a chamber defined by a turntable and a vacuum layer, the turntable rotates horizontally around an earth-vertical axis, the first three-axis accelerometer and the second three-axis accelerometer are arranged symmetrically on an x axis with respect to an origin of coordinates, both the first three-axis accelerometer and the second three-axis accelerometer have a distance of R from the origin of coordinates; the first three-axis accelerometer and the second three-axis accelerometer are arranged symmetrically on an z axis with respect to an origin of coordinates; and the first three-axis accelerometer and the second three-axis accelerometer are spaced at a distance of h on the z axis.

Optionally, the gravity gradient $\Gamma^g$ is:

$$\Gamma^g = \begin{bmatrix} \Gamma_{XX} & \Gamma_{XY} & \Gamma_{XZ} \\ \Gamma_{YX} & \Gamma_{YY} & \Gamma_{YZ} \\ \Gamma_{ZX} & \Gamma_{ZY} & \Gamma_{ZZ} \end{bmatrix}$$

wherein, $\Gamma_{XX}$, $\Gamma_{YY}$ and $\Gamma_{ZZ}$ are respectively the gravity gradient on the x axis, the y axis and the z axis, $\Gamma_{XY}$ and $\Gamma_{YX}$ are the gravity gradient on the x axis and the y axis, $\Gamma_{XZ}$ and $\Gamma_{ZX}$ the gravity gradient on the x axis and the z axis, and $\Gamma_{YZ}$ and $\Gamma_{ZY}$ are the gravity gradient on the y axis and the z axis, satisfying $\Gamma_{XX}+\Gamma_{YY}+\Gamma_{ZZ}=0$, $\Gamma_{XY}=\Gamma_{YX}$, $\Gamma_{XZ}=\Gamma_{ZX}$, $\Gamma_{YZ}=\Gamma_{ZY}$.

Optionally, determining the gravity gradient on the coordinate axes according to acceleration values measured by the first three-axis accelerometer and the second three-axis accelerometer includes:

using the formula $a_{1X}-a_{2X}=h \sin \omega t \Gamma_{YZ}-h \cos \omega t \Gamma_{XZ}+2R \sin 2\omega t \Gamma_{XY}-R \cos 2\omega t(\Gamma_{XX}-\Gamma_{YY})-R(\Gamma_{XX}+\Gamma_{YY})-2R\omega_z^2$ $a_{1Y}-a_{2Y}=h \cos \omega t \Gamma_{YZ}-h \sin \omega t \Gamma_{XZ}+2R \cos 2\omega t \Gamma_{XY}-R \sin 2\omega t(\Gamma_{XX}-\Gamma_{YY})+2R\dot\omega_z$ $a_{1Z}-a_{2Z}=2R \sin \omega t \Gamma_{YZ}-2R \cos \omega t \Gamma_{XZ}-h\Gamma_{ZZ}$ to determine components $\Gamma_{YZ}$, $\Gamma_{XZ}$, $\Gamma_{XY}$ and $\Gamma_{XX}-\Gamma_{YY}$ of the gravity gradient;

and determining a component $\Gamma_{ZZ}$ of the gravity gradient using the formula $\Gamma_{ZZ}=(a_{2Z}-a_{1Z})/h$;

wherein, $a_{1X}$, $a_{1Y}$ and $a_{1Z}$ respectively represent measurement outputs of the first three-axis accelerometer $a_1$ in the directions of the x axis, the y axis and the z axis;

$a_{2X}$, $a_{2Y}$ and $a_{2Z}$ respectively represent measurement outputs of the second three-axis accelerometer $a_2$ in the directions of the x axis, the y axis and the z axis; and ω is an angular velocity vector, and $\dot{\omega}_z$ is angular acceleration around the z axis.

Other features and advantages thereof of the present invention will become apparent through the detailed description of exemplary embodiments of the present invention in conjunction with the drawings.

BRIEF DESCRIPTION OF THE DRAWINGS

The drawings illustrated below are intended to facilitate better understanding of the present invention, and constitute a part of the present application. The exemplary embodiments as well as corresponding descriptions in the present invention are used to interpret the present invention, and shall not constitute undue limitation on the present invention. In the drawings.

DETAILED DESCRIPTION

Further detailed description of the present invention is made in conjunction with the drawings and embodiments.

Figure 1:
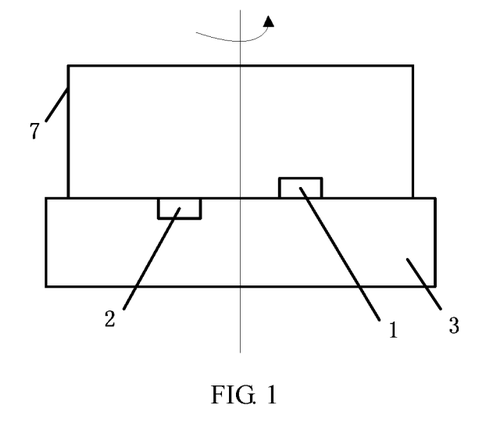
FIG. 1 is a view of a gravity gradient measurement apparatus of one embodiment of the present invention.

FIG. 1 is a view of a gravity gradient measurement apparatus of one embodiment of the present invention. As shown in FIG. 1, the gravity gradient measurement apparatus includes a turntable 3, a first three-axis accelerometer 1, a second three-axis accelerometer 2, a vacuum layer 7 and a measurement module, and the turntable 3 rotates horizontally around an earth-vertical axis, wherein:

a vacuum layer 7 is arranged on the turntable 3 and defines a first chamber with the turntable 3, the first three-axis accelerometer 1 and the second three-axis accelerometer 2 are located in the first chamber; the first three-axis accelerometer 1 and the second three-axis accelerometer 2 are arranged symmetrically on an x axis with respect to an origin of coordinates; both the first three-axis accelerometer 1 and the second three-axis accelerometer 2 have a distance of R from the origin of coordinates; the first three-axis accelerometer 1 and the second three-axis accelerometer 2 are arranged symmetrically on an z axis with respect to the origin of coordinates, and the first three-axis accelerometer 1 and the second three-axis accelerometer 2 are spaced at a distance of h on the z axis.

The measurement module (not shown in the drawings) determines a gravity gradient on the coordinate axes according to acceleration values measured by the first three-axis accelerometer 1 and the second three-axis accelerometer 2.

Figure 2:
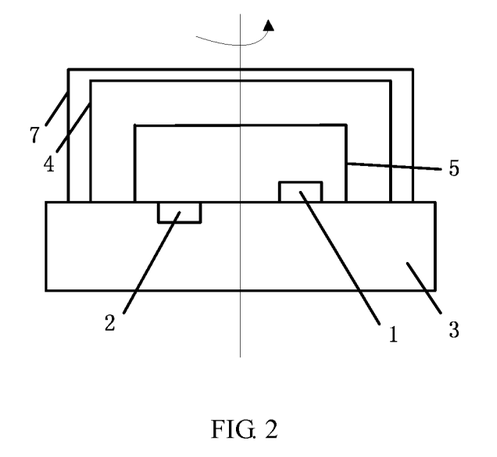
FIG. 2 is a view of a gravity gradient measurement apparatus of another embodiment of the present invention.

FIG. 2 is a view of a gravity gradient measurement apparatus of another embodiment of the present invention. Compared with the embodiment illustrated in FIG. 1, in the embodiment illustrated in FIG. 2, the gravity gradient measurement apparatus further includes an first magnetic shield 4 arranged in the first chamber for shielding the interference of the external geomagnetic field. The first magnetic shield 4 and the turntable 3 define a second chamber, in which the first three-axis accelerometer 1 and the second three-axis accelerometer 2 are located.

Optionally, the first magnetic shield 4 is a metal shield layer. For example, the material of the first magnetic shield 4 is permalloy.

Optionally, the gravity gradient measurement apparatus may also include a second magnetic shield 5 arranged in the second chamber for shielding the interference of an external alternating current magnetic field. The second magnetic shield 5 and the turntable 3 define a third chamber, in which the first three-axis accelerometer 1 and the second three-axis accelerometer 2 are located.

Optionally, the second magnetic shield 5 is a superconducting shield layer. For example, the material of the second magnetic shield 5 is a YBCO (yttrium barium copper oxide) metallic compound.

Figure 3:
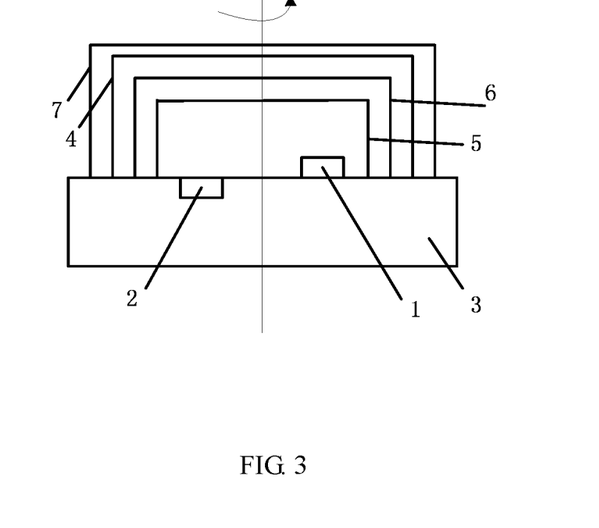
FIG. 3 is a view of a gravity gradient measurement apparatus of a further embodiment of the present invention.

FIG. 3 is a view of a gravity gradient measurement apparatus of a further embodiment of the present invention. Compared with the embodiment illustrated in FIG. 2, in the embodiment illustrated in FIG. 3, the gravity gradient measurement apparatus further includes a liquid nitrogen layer 6 arranged between the first magnetic shield 4 and the second magnetic shield 5.

The liquid nitrogen layer 6 is a cylindrical double-layer metal thin-wall layer, in which liquid nitrogen is filled. The liquid nitrogen layer 6 achieves an internal low temperature environment of about 77K, enabling the YBCO metallic compound of the second magnetic shield 5 to reach a superconducting state, reducing the thermal noise during Brownian motion of the first three-axis accelerometer 1 and the second three-axis accelerometer 2, and improving the measurement accuracy of the first three-axis accelerometer 1 and the second three-axis accelerometer 2.

Figure 4:
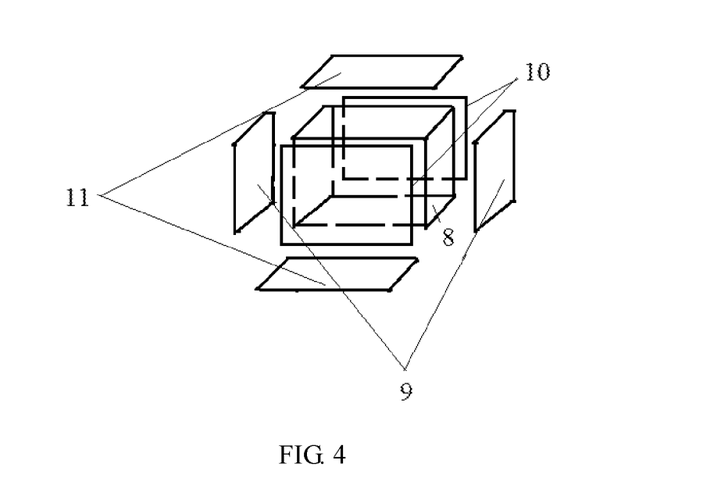
FIG. 4 is a structural view of a three-axis accelerometer electrode of the present invention.

As shown in FIG. 4, the above first three-axis accelerometer 1 and the second three-axis accelerometer 2 have the same structure and functions, and respectively include a suspended mass 8, an x-axis acceleration detection electrode 9, a y-axis acceleration detection electrode 10 and a z-axis acceleration detection electrode 11. The x-axis acceleration detection electrode 9, the y-axis acceleration detection electrode 10 and the z-axis acceleration detection electrode 11 define a cavity, the suspended mass 8 is suspended at a central position of the cavity. The suspended mass 8 is a hollow metal mass with an enclosed outer surface. The x-axis acceleration detection electrode 9, the y-axis acceleration detection electrode 10 and the z-axis acceleration detection electrode 11 realize measurement of the acceleration on the x axis, y axis and z axis through high frequency capacitance bridge circuit, i.e., measure the displacement of the suspended mass 8 in the directions of the x axis, the y axis and the z axis, and obtain the acceleration in the directions of the x axis, the y axis and the z axis through second-order derivation of the displacement against time. The x-axis acceleration detection electrode 9, the y-axis acceleration detection electrode 10 and the z-axis acceleration detection electrode 11 realize the functions of electrostatic force support and feedback control in the directions of orthogonal x axis, y axis and z axis via low frequency voltage loaded on the electrode.

To be noted, the gravity gradient $\Gamma^g$ is:

$$\Gamma^g = \begin{bmatrix} \Gamma_{XX} & \Gamma_{XY} & \Gamma_{XZ} \\ \Gamma_{YX} & \Gamma_{YY} & \Gamma_{YZ} \\ \Gamma_{ZX} & \Gamma_{ZY} & \Gamma_{ZZ} \end{bmatrix}$$

wherein, $\Gamma_{XX}$, $\Gamma_{YY}$ and $\Gamma_{ZZ}$ are respectively the gravity gradient on the x axis, the y axis and the z axis, $\Gamma_{XY}$ and $\Gamma_{YX}$ are the gravity gradient on the x axis and the y axis, $\Gamma_{XZ}$ and $\Gamma_{ZX}$ the gravity gradient on the x axis and the z axis, and $\Gamma_{YZ}$ and $\Gamma_{ZY}$, are the gravity gradient on the y axis and the z axis, satisfying $\Gamma_{XX}+\Gamma_{YY}+\Gamma_{ZZ}=0$, $\Gamma_{XY}=\Gamma_{YX}$, $\Gamma_{xz}=\Gamma_{zx}$, $\Gamma_{YZ}=\Gamma_{ZY}$.

Optionally, the measurement module may adopt the following formula $a_{1X}-a_{2X}=h \sin \omega t \Gamma_{YZ}-h \cos \omega t \Gamma_{XZ}+2R \sin 2\omega t \Gamma_{XY}-R \cos 2\omega t(\Gamma_{XX}-\Gamma_{YY})-R(\Gamma_{XX}+\Gamma_{YY})-2R\omega_z^2$ $a_{1Y}-a_{2Y}=h \cos \omega t \Gamma_{YZ}-h \sin \omega t \Gamma_{XZ}+2R \cos 2\omega t \Gamma_{XY}-R \sin 2\omega t(\Gamma_{XX}-\Gamma_{YY})+2R\dot{\omega}_z$ $a_{1Z}-a_{2Z}=2R \sin \omega t \Gamma_{YZ}-2R \cos \omega t \Gamma_{XZ}-h\Gamma_{ZZ}$ to determine components $\Gamma_{YZ}$, $\Gamma_{XZ}$, $\Gamma_{XY}$ and $\Gamma_{XX}-\Gamma_{YY}$ of the gravity gradient;

and determines a component $\Gamma_{ZZ}$ of the gravity gradient using the formula $\Gamma_{ZZ}=(a_{2Z}-a_{1Z})/h$;

wherein, $a_{1X}$, $a_{1Y}$, and $a_{1Z}$ respectively represent measurement outputs of the first three-axis accelerometer $a_1$ in the directions of the x axis, the y axis and the z axis;

$a_{2X}$, $a_{2Y}$, and $a_{2Z}$ respectively represent measurement outputs of the second three-axis accelerometer $a_2$ in the directions of the x axis, the y axis and the z axis; and co is an angular velocity vector, and $\dot{\omega}_z$ is angular acceleration around the z axis.

Figure 5:
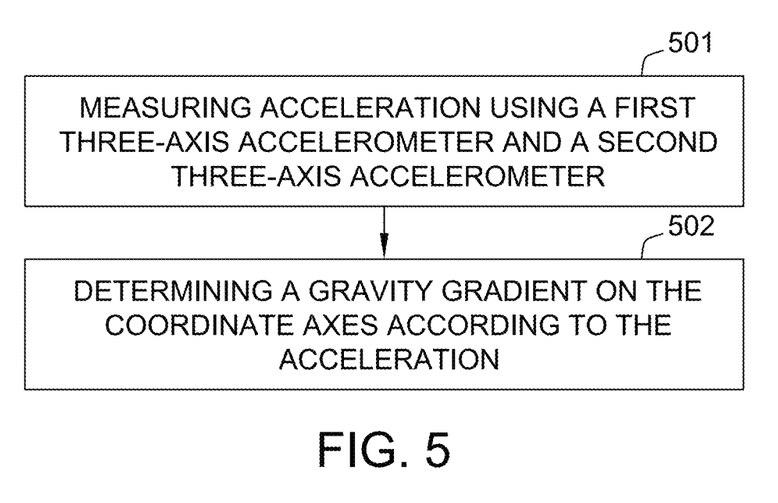
FIG. 5 is a diagram of a gravity gradient measuring method of one embodiment of the present invention.

FIG. 5 is a diagram for an embodiment of a gravity gradient measuring method of the present invention. The gravity gradient measuring method can be performed using the gravity gradient measurement apparatus involved in any embodiment in FIGS. 1-4.

Step 501, measuring acceleration using a first three-axis accelerometer and a second three-axis accelerometer.

Step 502, determining a gravity gradient on the coordinate axes according to the acceleration.

The measuring method adopted by the present invention will be described specifically as below.

Figure 6A:
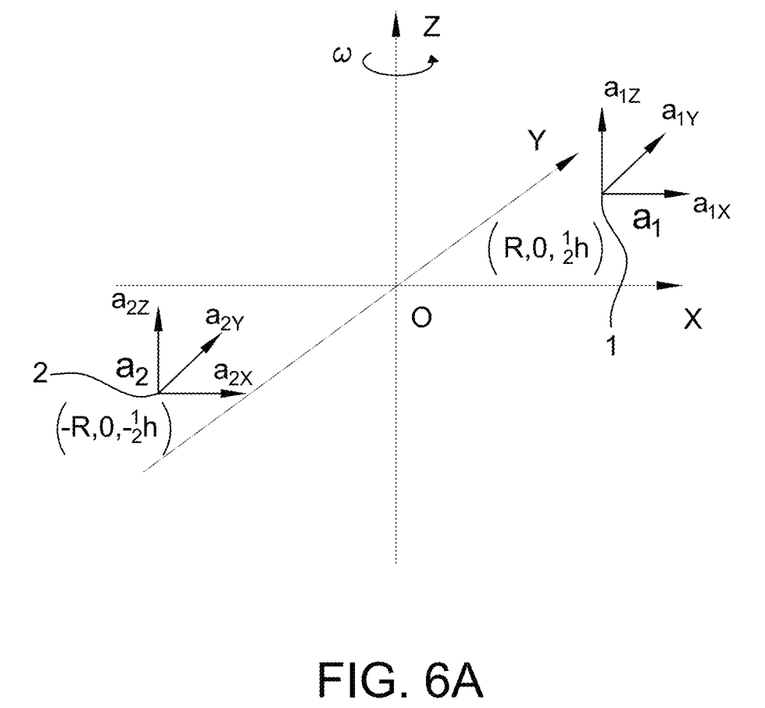
FIGS. 6a-6c are views of position arrangement of a three-axis accelerometer of the present invention.
Figure 6B:
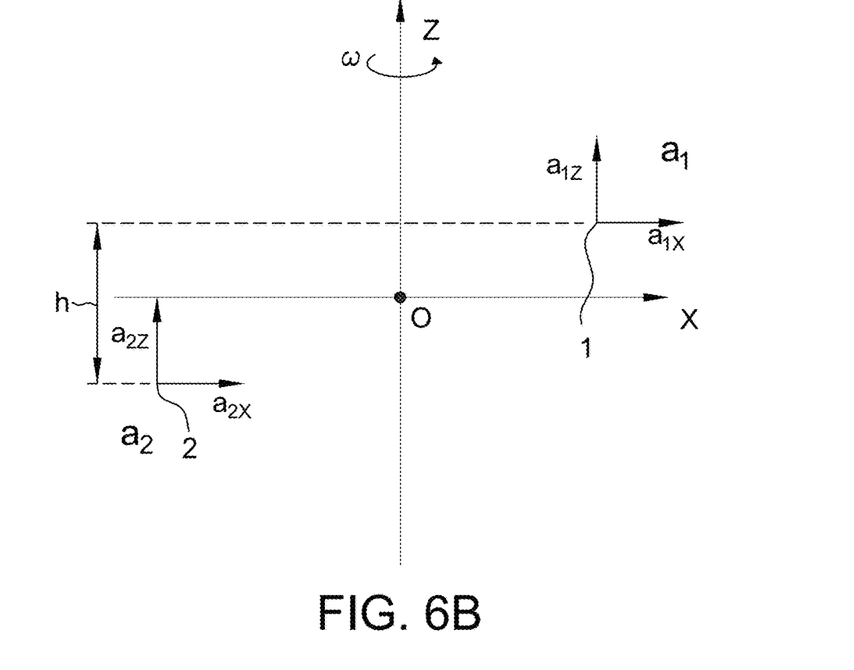
Figure 6C:
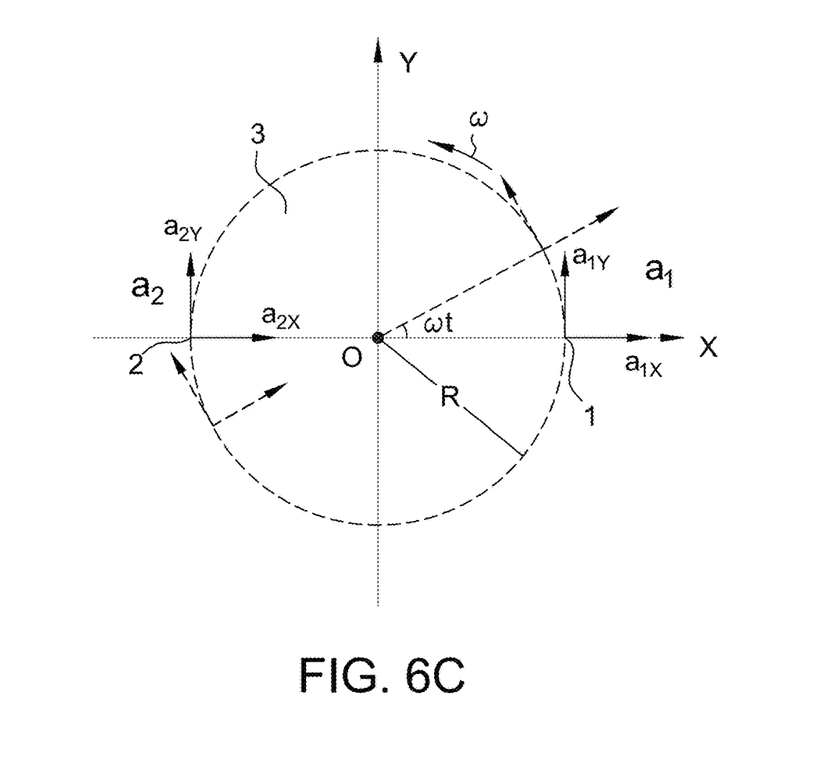

As shown in FIGS. 6a-6c, the position coordinates of the first three-axis accelerometer 1 and the second three-axis accelerometer 2 on the x axis, y axis and z axis are (R, 0, h/2) and (−R, 0, −h/2) respectively. Determining for the accelerometers a coordinate system $X_a$-O-$Y_a$, which is referred to as a coordinate system a and is located on the same plane as the coordinate system X-O-Y as shown in FIG. 6a-6c. However, the coordinate system a is fixedly connected with the three-axis accelerometers, which is to say, the accelerometer coordinate system $X_a$-O-$Y_a$ rotates along with the three-axis accelerometers, and the $X_g$-O-$Y_g$ is an inertial coordinate system.

FIG. 6a is a stereogram, FIG. 6b is a front view, and FIG. 6c is a top view.

Firstly, the first three-axis accelerometer 1 and the second three-axis accelerometer 2 are respectively used to measure the difference among linear accelerations in the directions of the x axis, y axis and z axis during rotation, and the linear accelerations in the directions of the x axis, y axis and z axis measured by the two three-axis accelerometers undergo subtraction, so as to obtain differential acceleration, and the relation between the differential acceleration and a gravity gradient parameter is shown with the following formula:

$$f_1^a - f_2^a = [\Gamma^a - (\dot{\omega} \times) - (\omega_{ia}^a \times)(\omega_{ia}^a \times)] \quad (1)$$
$$\rho^a = [\Gamma^a - \dot{\Omega}_{ia}^a - \Omega_{ia}^a \Omega_{ia}^a]\rho^a = L^a \rho^a$$

wherein, $f_1^a, f_2^a$ are respectively a measurement value matrix of the first three-axis accelerometer 1 and the second three-axis accelerometer 2 in the coordinate system a; $\Gamma^a$ is a gravity gradient matrix of the first three-axis accelerometer 1 and the second three-axis accelerometer 2 in the coordinate system a, the gravity gradient matrix in the inertial system may be obtained through coordinate conversion; $\rho^a$ is a difference matrix of the position vector of the first three-axis accelerometer 1 and the second three-axis accelerometer 2. The value is constant when the first three-axis accelerometer 1 and the second three-axis accelerometer 2 are located at relatively fixed positions with respect to each other; $L^a$ is a gradient measurement matrix obtained after direct differentiation of the displacement by the measurement of the first three-axis accelerometer 1 and the second three-axis accelerometer 2. The invention further includes an angular velocity $\Omega_{ia}^a \Omega_{ia}^a$ component and an angular acceleration component $\dot{\Omega}_{ia}^a$; $\omega$ is a rotation acceleration of the inertial coordinate system, and $\omega_{ia}^a$ is an angular velocity of the coordinate system a.

wherein, the angular velocity matrix is:

$$\Omega_{ia}^a \Omega_{ia}^a = \begin{bmatrix} -\omega_y^2 - \omega_z^2 & \omega_x \omega_y & \omega_x \omega_z \\ \omega_x \omega_y & -\omega_x^2 - \omega_z^2 & \omega_y \omega_z \\ \omega_x \omega_z & \omega_y \omega_z & -\omega_x^2 - \omega_y^2 \end{bmatrix} \quad (2)$$

The angular acceleration matrix is:

$$\dot{\Omega}_{ia}^a = \begin{bmatrix} 0 & -\dot{\omega}_z & \dot{\omega}_y \\ \dot{\omega}_z & 0 & -\dot{\omega}_x \\ -\dot{\omega}_y & \dot{\omega}_x & 0 \end{bmatrix} \quad (3)$$

The measurement matrix of the first three-axis accelerometer 1 and the second three-axis accelerometer 2 in the coordinate system a may be described as:

$$f_1^a = (a_{1X}, a_{1Y}, a_{1Z})^T, f_2^a = (a_{2X}, a_{2Y}, a_{2Z})^T \quad (4)$$

The displacement differentiation matrix is:

$$\rho^a = r_2^a - r_1^a = \begin{bmatrix} -R \\ 0 \\ -h/2 \end{bmatrix} - \begin{bmatrix} R \\ 0 \\ h/2 \end{bmatrix} = \begin{bmatrix} -2R \\ 0 \\ -h \end{bmatrix} \quad (5)$$

(4) and (5) are substituted in formula (1) to obtain:

$$\begin{bmatrix} a_{1X} - a_{2X} \\ a_{1Y} - a_{2Y} \\ a_{1Z} - a_{2Z} \end{bmatrix} = L^a \begin{bmatrix} -2R \\ 0 \\ -h \end{bmatrix} \quad (6)$$

$L^a$ is a gradient measurement matrix, which also includes components of the angular velocity and the angular acceleration, substituting the angular velocity matrix (2) and the angular acceleration matrix (3) into formula (6) to obtain:

$a_{1X}-a_{2X}=-2RL_{11}^a-hL_{13}^a=-2R(\Gamma_{XX}^a+\omega_y^2+\omega_z^2)-h(\Gamma_{XZ}^a-\omega_x\omega_z-\dot{\omega}_y)$ $$a_{1Y}-a_{2Y}=-2RL_{21}^a-hL_{23}^a=-2R(\Gamma_{YX}^a-\omega_x\omega_y-\dot\omega_z)-h(\Gamma_{YZ}^a-\omega_y\omega_z+\dot\omega_x)$$

$$a_{1Z}-a_{2Z}=-2RL_{31}^a-hL_{33}^a=-2R(\Gamma_{ZX}^a-\omega_x\omega_z+\dot\omega_y)-h(\Gamma_{ZZ}^a+\omega_x^2+\omega_y^2) \quad (7)$$

Hereby direct relation between the measurement of the first three-axis accelerometer 1 and the second three-axis accelerometer 2 and the gravity gradient in the coordinate system a is obtained, and the coordinate conversion from the gravity gradient in the coordinate system a into that in the inertial system is conducted as bellow.

The coordinate conversion from the gravity gradient in the coordinate system a into the gravity gradient in the inertial coordinate system is expressed in the following formula:

$$\Gamma^a = C_g^a \Gamma^g C_a^g \quad (8)$$

Figure 7:
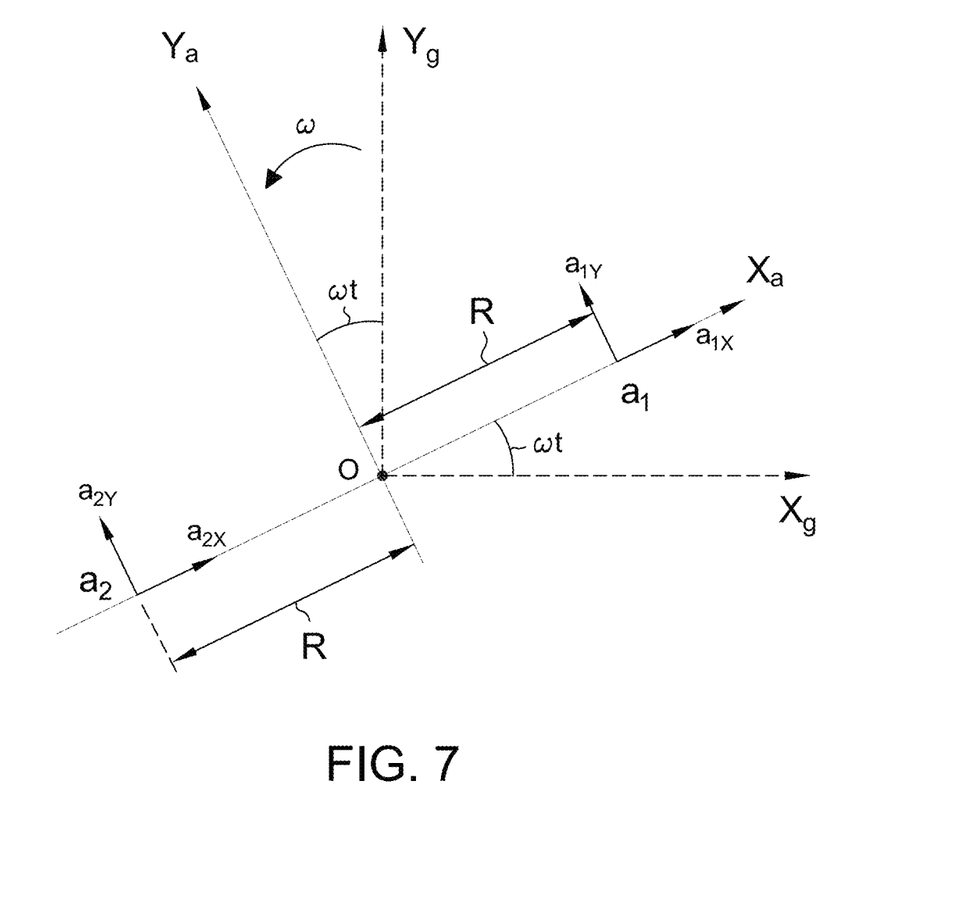
FIG. 7 is a diagram of coordinate rotation of a three-axis accelerometer of the present invention.

As shown in FIG. 7, when the coordinate system a rotates around the inertial system in an angular velocity of $\omega$, the transposed matrix of the conversion formula is:

$$C_g^a = \begin{bmatrix} \cos\omega t & -\sin\omega t & 0 \\ \sin\omega t & \cos\omega t & 0 \\ 0 & 0 & 1 \end{bmatrix}, \quad (9)$$

$$C_a^g = \begin{bmatrix} \cos\omega t & \sin\omega t & 0 \\ -\sin\omega t & \cos\omega t & 0 \\ 0 & 0 & 1 \end{bmatrix}$$

Substituting (9) in (8):

$$\Gamma^a = \begin{bmatrix} \Gamma_{XX}^a & \Gamma_{XY}^a & \Gamma_{XZ}^a \\ \Gamma_{YX}^a & \Gamma_{YY}^a & \Gamma_{YZ}^a \\ \Gamma_{ZX}^a & \Gamma_{ZY}^a & \Gamma_{ZZ}^a \end{bmatrix} \quad (10)$$

$$= \begin{bmatrix} \cos\omega t & -\sin\omega t & 0 \\ \sin\omega t & \cos\omega t & 0 \\ 0 & 0 & 1 \end{bmatrix} \cdot \begin{bmatrix} \Gamma_{XX} & \Gamma_{XY} & \Gamma_{XZ} \\ \Gamma_{YX} & \Gamma_{YY} & \Gamma_{YZ} \\ \Gamma_{ZX} & \Gamma_{ZY} & \Gamma_{ZZ} \end{bmatrix} \cdot \begin{bmatrix} \cos\omega t & \sin\omega t & 0 \\ -\sin\omega t & \cos\omega t & 0 \\ 0 & 0 & 1 \end{bmatrix}$$

Thus:

$$\Gamma_{XX}^a = (1/)(\Gamma_{XX}-\Gamma_{YY})\cos 2\omega t - \Gamma_{XY}\sin 2\omega t + (1/2)(\Gamma_{XX}+\Gamma_{YY})$$

$$\Gamma_{XY}^a = (1/2)(\Gamma_{XX}-\Gamma_{YY})\sin 2\omega t - \Gamma_{XY}\cos 2\omega t$$

$$\Gamma_{XZ}^a = \cos\omega t\Gamma_{XZ} - \sin\omega t\Gamma_{YZ}$$

$$\Gamma_{YZ}^a = \sin\omega t\Gamma_{XZ} + \cos\omega t\Gamma_{YZ}$$

$$\Gamma_{ZZ}^a = \Gamma_{ZZ}$$

Because the first three-axis accelerometer 1 and the second three-axis accelerometer 2 only rotate around the z axis, $\omega_x=\omega_y=0$, $\omega_z$ is constantly equal to $\omega$, (10) is substituted in (7), therefore:

$$a_{1X}-a_{2X}=h\sin\omega t\Gamma_{YZ}-h\cos\omega t\Gamma_{XZ}+2R\sin 2\omega t\Gamma_{XY}-R\cos 2\omega t(\Gamma_{XX}-\Gamma_{YY})-R(\Gamma_{XX}+\Gamma_{YY})-2R\omega_z^2$$

$$a_{1Y}-a_{2Y}=h\cos\omega t\Gamma_{YZ}-h\sin\omega t\Gamma_{XZ}+2R\cos 2\omega t\Gamma_{XY}-R\sin 2\omega t(\Gamma_{XX}-\Gamma_{YY})+2R\dot\omega_z$$

$$a_{1Z}-a_{2Z}=2R\sin\omega t\Gamma_{YZ}-2R\cos\omega t\Gamma_{XZ}-h\Gamma_{ZZ} \quad (11)$$

After analysing the results of Formula (11), it can be seen that four gravity gradient components $\Gamma_{YZ}$, $\Gamma_{XZ}$, $\Gamma_{XY}$, $(\Gamma_{XX}-\Gamma_{YY})$ are respectively added to 1 frequency and double-frequency orthogonal signals of rotational angular velocity $\omega$ of combined outputs of the first three-axis accelerometer 1 and the second three-axis accelerometer 2. First, the four gravity gradient components $\Gamma_{YZ}$, $\Gamma_{XZ}$, $\Gamma_{XY}$, $(\Gamma_{XX}-\Gamma_{YY})$ undergo frequency division to respectively obtain the 1 frequency and double-frequency orthogonal signals which are respectively amplified and demodulated, following by separation via two detection signals with a phase difference of 90°, thus obtaining four 4 gravity gradient components. The $\Gamma_{ZZ}$ component is a constant of the combined acceleration output $a_{1Z}-a_{2Z}$ in the z-axis direction, i.e., $\Gamma_{ZZ}=(a_{2Z}-a_{1Z})/h$, the difference between the outputs of $a_{1Z}$ and $a_{2Z}$ is directly filtered to obtain the component. Hereby all five independent components of the gravity gradient are obtained, thus obtaining a full-tensor gravity gradient.

The symbols in the above formula and representation have the following meanings:

X,Y,Z: three axes in the space;

O: the origin of the axes in the space;

$a_1$, $a_2$: respectively represent the first three-axis accelerometer 1 and the second three-axis accelerometer 2;

$a_{1X}$, $a_{1Y}$, $a_{1Z}$: respectively represent measurement outputs of the first three-axis accelerometer $a_1$ in the directions of the X,Y,Z axis;

$a_{2X}$, $a_{2Y}$, $a_{2Z}$: respectively represent measurement outputs of the second three-axis accelerometer $a_2$ in the directions of the X, Y, Z axis;

R: the distance of the first three-axis accelerometer $a_1$ and the second three-axis accelerometer $a_2$ on the z axis with respect to the origin O;

h: the distance of the first three-axis accelerometer $a_1$ and the second three-axis accelerometer $a_2$ on the z axis;

$\omega$: the angular velocity vector, generally has three components $\omega_x$, $\omega_y$, $\omega_z$, and is a 3×1 vector, with a scalar value equal to $\omega_z$, because the apparatus of the present invention only rotates around the Z axis;

$\dot\omega$: the angular acceleration vector, is a first-order derivative of the angular velocity $\omega$, generally has three components $\dot\omega_x$, $\dot\omega_y$, $\dot\omega_z$, and is a 3×1 vector, wherein $\dot\omega_z=0$ when ideal uniform angular velocity rotation is conducted;

$\omega_x$, $\omega_y$, $\omega_z$: are respectively the angular velocity around the x axis, y axis, and z axis. The direction of the angular velocity vector can be determined by the right-hand rule, i.e., the axis around which the rotation is conducted is the direction of the angular velocity of the axis;

$\dot\omega_x$, $\dot\omega_y$, $\dot\omega_z$: are respectively the angular acceleration around the x axis, y axis and z axis;

$X_a$-O-$Y_a$: is the coordinate system a on the X-O-Y plane fixedly connected with the three-axis accelerometers, and rotating along with the three-axis accelerometers, i.e., the three-axis accelerometers have a position vector remaining constant in the $X_a$-O-$Y_a$ coordinate system;

$X_g$-O-$Y_g$: is the coordinate system g on the X-O-Y plane, and is a static inertial system not rotating along with the three-axis accelerometers;

$f_1^a$, $f_2^a$: are respectively an measurement matrix of the two three-axis accelerometer in the coordinate system a;

$\Gamma^a$: is the gravity gradient matrix of the three-axis accelerometers in the coordinate system a;

$\Gamma^g$: is the coordinate system g, i.e., the gravity gradient matrix in the inertial coordinate system;

$r_1^a$: the position vector of the first three-axis accelerometer $a_1$ in the coordinate system a, and is (R, 0, ½h);

$r_2^a$: the position vector of the second three-axis accelerometer $a_2$ in the coordinate system a, and is $(-R, 0, -\frac{1}{2}h)$;

$\rho^a$: is the difference matrix of the position vector of the first three-axis accelerometer $a_1$ and the second three-axis accelerometer $a_2$ in the coordinate system a;

$\Omega$: the angular velocity matrix;

$\dot{\Omega}$: the angular acceleration matrix;

$L^a$: the gradient measurement matrix, which is obtained through direct division of combinations of the outputs from the accelerometer by the differential displacement, including the angular velocity and the angular acceleration and other components, and is endowed with a superscript a on the top right, as it is in the a coordinate system;

The gradient measurement matrix $L^a$ includes:

$$\begin{bmatrix} L_{11}^a & L_{12}^a & L_{13}^a \\ L_{21}^a & L_{22}^a & L_{23}^a \\ L_{31}^a & L_{32}^a & L_{33}^a \end{bmatrix}$$

The gradient matrix $\Gamma^a$ in the coordinate system a includes:

$$\begin{bmatrix} \Gamma_{XX}^a & \Gamma_{XY}^a & \Gamma_{XZ}^a \\ \Gamma_{YX}^a & \Gamma_{YY}^a & \Gamma_{YZ}^a \\ \Gamma_{ZX}^a & \Gamma_{ZY}^a & \Gamma_{ZZ}^a \end{bmatrix}$$

The gradient matrix $\Gamma^g$ in the inertial coordinate system g includes:

$$\begin{bmatrix} \Gamma_{XX} & \Gamma_{XY} & \Gamma_{XZ} \\ \Gamma_{YX} & \Gamma_{YY} & \Gamma_{YZ} \\ \Gamma_{ZX} & \Gamma_{ZY} & \Gamma_{ZZ} \end{bmatrix},$$

wherein $\Gamma^g$ is also a target gradient matrix in the measuring method of the present invention.

The present invention enables convenient measurement of a full-tensor gravity gradient through two three-axis accelerometers.

The description of the present invention is made in an attempt to facilitate exemplary description thereof, and is not exhaustive or intended to confine the present invention to the disclosed implementations. Multiple modifications and changes are obvious to those skilled in the art. And selecting and describing the embodiments are aimed at better illustrate the principle and practical applications of the present invention, and enabling one with ordinary skill in the art to understand the present invention and to devise various embodiments with various modifications suitable for specific uses.

The invention claimed is:

1. A gravity gradient measurement apparatus, comprising
a turntable (3), rotating horizontally around an earth-vertical axis,
a first three-axis accelerometer (1),
a second three-axis accelerometer (2),
a vacuum layer (7), arranged on the turntable and defining a first chamber with the turntable, and
a measurement module;

wherein,
the first three-axis accelerometer (1) and the second three-axis accelerometer (2) are located in the first chamber;
the first three-axis accelerometer (1) and the second three-axis accelerometer (2) are arranged symmetrically on an x axis with respect to an origin of coordinates;
both the first three-axis accelerometer (1) and the second three-axis accelerometer (2) have a distance of R from the origin of coordinates;
the first three-axis accelerometer (1) and the second three-axis accelerometer (2) are arranged symmetrically on a z axis with respect to the origin of coordinates; and
the first three-axis accelerometer and the second three-axis accelerometer are spaced at a distance of h on the z axis; and
the measurement module determines a gravity gradient on the coordinate axes according to acceleration values measured by the first three-axis accelerometer (1) and the second three-axis accelerometer (2);
wherein a first magnetic shield (4) is arranged in the first chamber for shielding the interference of the external geomagnetic field, the first magnetic shield (4) and the turntable (3) define a second chamber, in which the first three-axis accelerometer (1) and the second three-axis accelerometer (2) are located;
wherein a second magnetic shield (5) is arranged in the second chamber for shielding the interference of an external alternating current magnetic field, the second magnetic shield (5) and the turntable (3) define a third chamber, in which the first three-axis accelerometer (1) and the second three-axis accelerometer (2) are located.

2. The gravity gradient measurement apparatus of claim 1, wherein,
the first magnetic shield (4) is a metal shield layer.

3. The gravity gradient measurement apparatus of claim 2, wherein,
the material of the first magnetic shield (4) is permalloy.

4. The gravity gradient measurement apparatus of claim 1, further comprising:
a liquid nitrogen layer (6), arranged between the first magnetic shield (4) and the second magnetic shield (5).

5. The gravity gradient measurement apparatus of claim 4, wherein,
the second magnetic shield (5) is a superconducting shield layer.

6. The gravity gradient measurement apparatus of claim 5, wherein,
the material of the second magnetic shield (5) is a YBCO metallic compound.

7. The gravity gradient measurement apparatus of claim 1, wherein,
the first three-axis accelerometer (1) and the second three-axis accelerometer (2) respectively comprises a suspended mass (8), an x-axis acceleration detection electrode (9), a y-axis acceleration detection electrode (10) and a z-axis acceleration detection electrode (11);
the x-axis acceleration detection electrode (9), the y-axis acceleration detection electrode (10) and the z-axis acceleration detection electrode (11) define a cavity; and
the suspended mass (8) is suspended at a central position of the cavity;
the x-axis acceleration detection electrode (9), the y-axis acceleration detection electrode (10) and the z-axis acceleration detection electrode (11) are configured to measure a displacement of the suspended mass (8) in the directions of the x axis, the y axis and the z axis, respectively, so as to obtain the acceleration in the directions of the x axis, the y axis and the z axis according to the measured displacement.

8. The gravity gradient measurement apparatus of claim 7, wherein,
the suspended mass (8) is a hollow metal mass with an enclosed outer surface.

9. The gravity gradient measurement apparatus in accordance with claim 1, wherein,
the gravity gradient $\Gamma^g$ is:

$$\Gamma^g = \begin{bmatrix} \Gamma_{XX} & \Gamma_{XY} & \Gamma_{XZ} \\ \Gamma_{YX} & \Gamma_{YY} & \Gamma_{YZ} \\ \Gamma_{ZX} & \Gamma_{ZY} & \Gamma_{ZZ} \end{bmatrix}$$

wherein, $\Gamma_{XX}$, $\Gamma_{YY}$ and $\Gamma_{ZZ}$ are respectively the gravity gradient on the x axis, the y axis and the z axis, $\Gamma_{XY}$ and $\Gamma_{YX}$ are the gravity gradient on the x axis and the y axis, $\Gamma_{XZ}$ and $\Gamma_{ZX}$ the gravity gradient on the x axis and the z axis, and $\Gamma_{YZ}$ and $\Gamma_{ZY}$ are the gravity gradient on the y axis and the z axis, satisfying $\Gamma_{XX}+\Gamma_{YY}+\Gamma_{ZZ}=0$, $\Gamma_{XY}=\Gamma_{YX}$, $\Gamma_{xz}=\Gamma_{zx}$, $\Gamma_{YZ}=\Gamma_{ZY}$.

10. The gravity gradient measurement apparatus of claim 9, wherein,
specifically, the measurement module adopts the following formula $a_{1X}-a_{2X}=h \sin \omega t \Gamma_{YZ}-h \cos \omega t \Gamma_{XZ}+2R \sin 2\omega t \Gamma_{XY}-R \cos 2\omega t(\Gamma_{XX}-\Gamma_{YY})-R(\Gamma_{XX}+\Gamma_{YY})-2R\omega_z^2$ $a_{1Y}-a_{2Y}=h \cos \omega t \Gamma_{YZ}-h \sin \omega t \Gamma_{XZ}+2R \cos 2\omega t \Gamma_{XY}-R \sin 2\omega t(\Gamma_{XX}-\Gamma_{YY})+2R\dot\omega_z$ $a_{1Z}-a_{2Z}=2R \sin \omega t \Gamma_{YZ}-2R \cos \omega t \Gamma_{XZ}-h\Gamma_{ZZ}$ to determine components $\Gamma_{YZ}$, $\Gamma_{XZ}$, $\Gamma_{XY}$ and $\Gamma_{XX}-\Gamma_{YY}$ of the gravity gradient;
and determines a component $\Gamma_{ZZ}$ of the gravity gradient using the formula $\Gamma_{ZZ}=(a_{2Z}-a_{1Z})/h$;
wherein, $a_{1X}$, $a_{1Y}$, and $a_{1Z}$ respectively represent measurement outputs of the first three-axis accelerometer $a_1$ in the directions of the x axis, the y axis and the z axis;
$a_{2X}$, $a_{2Y}$, and $a_{2Z}$ respectively represent measurement outputs of the second three-axis accelerometer $a_2$ in the directions of the x axis, the y axis and the z axis; and
$\omega$ is an angular velocity vector, and $\dot\omega_z$ is angular acceleration around the z axis.

11. A gravity gradient measurement method, comprising:
measuring acceleration using a first three-axis accelerometer (1) and a second three-axis accelerometer (2); and
determining a gravity gradient on the coordinate axes according to the acceleration;
wherein,
the first three-axis accelerometer (1) and the second three-axis accelerometer (2) are arranged in a first chamber defined by a turntable (3) and a vacuum layer (7);
the turntable (3) rotates horizontally around an earth-vertical axis;
the first three-axis accelerometer (1) and the second three-axis accelerometer (2) are arranged symmetrically on an x axis with respect to an origin of coordinates;
both the first three-axis accelerometer (1) and the second three-axis accelerometer (2) have a distance of R from the origin of coordinates;
the first three-axis accelerometer (1) and the second three-axis accelerometer (2) are arranged symmetrically on a z axis with respect to an origin of coordinates; and
the first three-axis accelerometer and the second three-axis accelerometer are spaced at a distance of h on the z axis;
a first magnetic shield (4) is arranged in the first chamber for shielding the interference of the external geomagnetic field, the first magnetic shield (4) and the turntable (3) define a second chamber, in which the first three-axis accelerometer (1) and the second three-axis accelerometer (2) are located;
a second magnetic shield (5) is arranged in the second chamber for shielding the interference of an external alternating current magnetic field, the second magnetic shield (5) and the turntable (3) define a third chamber, in which the first three-axis accelerometer (1) and the second three-axis accelerometer (2) are located.

12. The method of claim 11, wherein,
the gravity gradient $\Gamma^g$ is:

$$\Gamma^g = \begin{bmatrix} \Gamma_{XX} & \Gamma_{XY} & \Gamma_{XZ} \\ \Gamma_{YX} & \Gamma_{YY} & \Gamma_{YZ} \\ \Gamma_{ZX} & \Gamma_{ZY} & \Gamma_{ZZ} \end{bmatrix}$$

wherein, $\Gamma_{XX}$, $\Gamma_{YY}$ and $\Gamma_{ZZ}$ are respectively the gravity gradient on the x axis, the y axis and the z axis, $\Gamma_{XY}$ and $\Gamma_{YX}$ are the gravity gradient on the x axis and the y axis, $\Gamma_{XZ}$ and $\Gamma_{ZX}$ the gravity gradient on the x axis and the z axis, and $\Gamma_{YZ}$ and $\Gamma_{ZY}$ are the gravity gradient on the y axis and the z axis, satisfying $\Gamma_{XX}+\Gamma_{YY}+\Gamma_{ZZ}=0$, $\Gamma_{XY}=\Gamma_{YX}$, $\Gamma_{xz}=\Gamma_{zx}$, $\Gamma_{YZ}=\Gamma_{ZY}$.

13. The method of claim 12, wherein,
determining the gravity gradient on the coordinate axes according to acceleration values measured by the first three-axis accelerometer (1) and the second three-axis accelerometer (2) comprises:
using the formula $a_{1X}-a_{2X}=h \sin \omega t \Gamma_{YZ}-h \cos \omega t \Gamma_{XZ}+2R \sin 2\omega t \Gamma_{XY}-R \cos 2\omega t(\Gamma_{XX}-\Gamma_{YY})-R(\Gamma_{XX}+\Gamma_{YY})-2R\omega_z^2$ $a_{1Y}-a_{2Y}=h \cos \omega t \Gamma_{YZ}-h \sin \omega t \Gamma_{XZ}+2R \cos 2\omega t \Gamma_{XY}-R \sin 2\omega t(\Gamma_{XX}-\Gamma_{YY})+2R\dot\omega_z$ $a_{1Z}-a_{2Z}=2R \sin \omega t \Gamma_{YZ}-2R \cos \omega t \Gamma_{XZ}-h\Gamma_{ZZ}$ to determine components $\Gamma_{YZ}$, $\Gamma_{XZ}$, $\Gamma_{XY}$ and $\Gamma_{XX}-\Gamma_{YY}$ of the gravity gradient;
and determines a component $\Gamma_{ZZ}$ of the gravity gradient using the formula $\Gamma_{ZZ}=(a_{2Z}-a_{1Z})/h$;
wherein, $a_{1X}$, $a_{1Y}$, and $a_{1Z}$ respectively represent measurement outputs of the first three-axis accelerometer $a_1$ in the directions of the x axis, the y axis and the z axis;
$a_{2X}$, $a_{2Y}$, and $a_{2Z}$ respectively represent measurement outputs of the second three-axis accelerometer $a_2$ in the directions of the x axis, the y axis and the z axis; and
$\omega$ is an angular velocity vector, and $\dot\omega_z$ is angular acceleration around the z axis.

* * * * *